United States Patent [19]
Ohsaki

[11] Patent Number: 5,677,243
[45] Date of Patent: Oct. 14, 1997

[54] METHOD OF FORMING MULTI-LAYER INTERCONNECTION

[75] Inventor: Akihiko Ohsaki, Hyogo, Japan

[73] Assignee: Mitsubishi Denki Kabushiki Kaisha, Tokyo, Japan

[21] Appl. No.: 614,579

[22] Filed: Mar. 13, 1996

[30] Foreign Application Priority Data

Oct. 19, 1995 [JP] Japan .................... 7-271399

[51] Int. Cl.⁶ .................................. H01L 21/44
[52] U.S. Cl. .......................... 437/195; 437/228; 437/229
[58] Field of Search .................... 437/195, 190, 437/229, 228

[56] References Cited

U.S. PATENT DOCUMENTS

| | | | |
|---|---|---|---|
| 4,997,790 | 3/1991 | Woo et al. | 437/195 |
| 5,026,666 | 6/1991 | Hills et al. | 437/195 |
| 5,158,910 | 10/1992 | Cooper et al. | 437/195 |
| 5,187,121 | 2/1993 | Cote et al. | 437/195 |
| 5,434,451 | 7/1995 | Dalal et al. | 257/768 |
| 5,461,004 | 10/1995 | Kim | 437/195 |

OTHER PUBLICATIONS

K. Kikuta et al, Multilevel Planarized-Trench-Aluminum (PTA) Interconnection using Reflow Sputtering and Chemical Mechanical Polishing, ULSI Device Development Laboratories, IEDM 1993, pp. 285–288.

Carter W. Kaanta et al, Dual Damascene: A ULSI wiring Technology, IBM General Technology Division, VMIC Conference, 1991, pp. 114–152.

*Primary Examiner*—John Niebling
*Assistant Examiner*—C. Everhart
*Attorney, Agent, or Firm*—Lowe, Price, LeBlanc & Becker

[57] ABSTRACT

A method of forming a multi-layer interconnection is provided by which a resist pattern can be precisely formed by maintaining a uniform resist pattern film thickness and such problems as reduced electric resistance of a connecting portion and defective connection between a first interconnection layer and a second interconnection layer will not occur by ensuring a sufficient diameter of a contact hole. The method includes the steps of: removing a portion of an insulating layer having a main surface and covering a first conductive layer to form a hole reaching the first conductive layer in the insulating layer; forming an organic layer at least filling the hole; removing a portion of the insulating layer at a portion at which the insulating layer contacts an organic layer filling the hole; removing the organic layer filling the hole to form a recessed portion continuous to the hole in the insulating layer; and forming a second conductive layer in such a manner that it fills the hole and the recessed portion.

22 Claims, 16 Drawing Sheets

METHOD OF FORMING MULTI-LAYER INTERCONNECTION

BACKGROUND OF THE INVENTION

1. Field of the Invention

The present invention relates to a method of forming a multi-layer interconnection, and particularly to a method of forming a finely-patterned, buried multi-layer interconnection for an integrated circuit.

2. Description of the Background Art

As higher memory integration is quite promoted, the width of an interconnection layer used for a memory is more finely patterned. For a dynamic random access memory (DRAM) with a memory capacity of 16 mega bits, for example, the design rule of the width of the interconnection layer is 0.5 μm. As the interconnection layer is finely-patterned to a width of 0.5 μm, the diameter of a contact hole which connects one interconnection layer to another is almost the same as the width of the interconnection layers. With such a fine-patterning, various methods of forming a multi-layer interconnection have been proposed.

FIGS. 25–33 are cross sectional views illustrating a method of forming the buried multi-layer interconnection described in *Proceeding of VMIC Conference*, pp. 144–152, 1991. With reference to those figures, a conventional method of forming a buried multi-layer interconnection will be described.

Referring to FIG. 25, a first interconnection layer 601 is covered by an interlayer insulating film 602. A surface of interlayer insulating film 602 is planarized. A resist pattern 603 for a contact hole is formed on the surface of interlayer insulating film 602 by photolithography. Resist pattern 603 is provided with a hole 616 having a diameter of d. The contact hole is formed directly below hole 616.

Referring to FIG. 26, a resist 604 is formed on interlayer insulating film 602 and resist pattern 603.

Referring to FIG. 27, a pattern of a second interconnection layer is transferred onto resist 604 by the light indicated by arrows 617, 618.

Referring to FIG. 28, resist 604 is developed and a resist pattern 614 for the second interconnection layer is thus formed.

Referring to FIG. 29, resist patterns 603 and 614 are used as a mask and interlayer insulating film 602 is dry etched to form a contact hole 606. Contact hole 606 is formed such that its bottom wall may not reach the first interconnection layer 601.

Referring to FIG. 30, resist pattern 614 is used as a mask and resist pattern 603 is dry etched to form a hole 615 for the first interconnection layer.

Referring to FIG. 31, resist pattern 614 is used as a mask and interlayer insulating film 602 is dry etched to form a hole 607, 608 for the second interconnection layer in interlayer insulating film 602. At that time, contact hole 606 has its bottom wall formed to reach the first interconnection layer 601. Then, resist patterns 603 and 614 are removed.

Referring to FIG. 32, a metal film 609 forming the second interconnection layer and the connecting portion is formed by a method having good coverage such as chemical vapor deposition. Contact hole 606 and holes 607, 608 are filled with metal film 609.

Referring to FIG. 33, metal film 609 is polished by chemical mechanical polishing method and a connecting portion 611 and a second interconnection layer 610 are thus formed.

In the method of forming a multi-layer interconnection above, in the step shown in FIG. 27, light 617 for the pattern of the second interconnection layer to be transferred exactly onto hole 616 for the contact hole is sometimes displaced from hole 616 due to a mechanical error of the photolithography machine and other factors. Thus, a region 619 on which resist 604 is thicker and a region 620 on which resist 604 is thinner are formed. In region 619 with the thicker resist, resolution at the time of pattern exposure is degraded and resist pattern 614 cannot be formed precisely.

Furthermore, as shown in FIGS. 27 and 28, the diameter of hole 616a is smaller than that of hole 616 by the width of region 620 with the thinner resist (i.e., the width of the displacement). Accordingly, if the diameter d of hole 616 is decreased to 0.25 μm, the diameter of hole 616a and hence that of contact hole 606 formed thereby are decreased to as small as 0.15 μm, since the maximum width of the above displacement is approximately 0.1 μm. Accordingly, an electric resistance of connecting portion 611 shown in FIG. 33 increases. In the step shown in FIG. 32, it is impossible for contact hole 606 to be filled with metal film 609 and the first and second interconnection layers cannot be electrically connected to each other.

SUMMARY OF THE INVENTION

One object of the present invention is to provide a method of forming a multi-layer interconnection capable of precisely forming a resist pattern by maintaining a certain film thickness of the resist pattern.

Another object of the present invention is to provide a method of forming a multi-layer interconnection in which defective connection between the first and the second interconnection layers can be prevented by ensuring a sufficient diameter of the contact hole and hence decreasing the electric resistance of the connecting portion.

A method of forming a multi-layer interconnection according to one aspect of the present invention includes the steps of: removing a portion of an insulating layer having a main surface and covering a first conductive layer formed on a semiconductor substrate to form in the insulating layer a hole reaching the first conductive organic layer filling the hole; removing the organic layer; forming an organic layer at least filling the hole; removing a portion of the insulating layer contacting the filling the hole to form in the insulating layer a recessed portion continuous to the hole; and forming a second conductive layer in such a manner that it fills the hole and the resist portion.

Furthermore, the step of forming the hole may include forming a resist pattern on the main surface of the insulating layer and removing the insulating layer according to the resist pattern.

Furthermore, the step of forming the organic layer may include filling the hole with an organic layer while forming an organic layer on the main surface of the insulating layer and then etching-back the organic layer until the main surface of the insulating layer appears.

Furthermore, the step of removing a portion of the insulating layer may include forming a resist pattern on a main surface of the insulating layer and removing the insulating layer according to the resist pattern.

Furthermore, the first conductive layer may be at least one component selected from the group consisting of an impurity region formed in the semiconductor substrate and interconnection layers formed on the semiconductor substrate.

Furthermore, the present invention is notably effective when the width of the first and second conductive layers is less than 0.5 μm.

In the method of forming a multi-layer interconnection above, a hole reaching a first conductive layer is firstly formed in an insulating layer and then the hole is filled with an organic layer, so that a sufficient diameter of the hole serving as a contact hole can be obtained. Accordingly, increased electric resistance at the connecting portion and defective connection between the first and second interconnection layers can be prevented.

Furthermore, in the step of forming the hole or in the step of removing a portion of the insulating layer, a certain film thickness of the resist can be maintained in forming a resist pattern for removing the insulating layer so that resolution will not be degraded at the time of transferring the pattern.

A particularly notable effect can be expected when the width of the conductive layer is less than 0.5 μm.

A method of forming a multi-layer interconnection according to another aspect of the present invention includes the steps of: removing a portion of an insulating layer having a main surface and covering a first conductive layer formed on a semiconductor substrate to form in the insulating layer a hole reaching the first conductive layer; forming an organic layer to fill the hole and to cover the main surface of the insulating layer; removing a portion of the insulating layer contacting the organic layer filling the hole, and a portion of the organic layer formed on the portion of the insulating layer; removing the organic layer filling the hole to form in the insulating layer a recessed portion continuous to the hole; and forming a second conductive layer in such a manner that it fills the hole and the recessed portion.

Furthermore, the step of forming the hole may include forming a resist pattern on the main surface of the insulating layer and removing the insulating layer according to the resist pattern.

Furthermore, the step of removing a portion of the insulating layer and a portion of the organic layer may include forming a resist pattern on the organic layer and removing the insulating layer and the organic layer according to the resist pattern.

Furthermore, the first conductive layer may be at least one component selected from the group consisting of an impurity region formed in the semiconductor substrate and interconnection layers formed on the semiconductor substrate.

Furthermore, the present invention is notably effective when the width of the first and second conductive layers is less than 0.5 μm.

Furthermore, the organic layer preferably include antireflection material.

In the method of forming a multi-layer interconnection above, since a hole reaching a first conductive layer is firstly formed in an insulating layer and an organic layer is formed to fill the hole, a sufficient diameter of the hole serving as a contact hole is obtained. Accordingly, increased electric resistance at the connecting portion and defective connection between the first and second interconnection layers can be prevented.

Furthermore, in the step of forming the hole or in the step of removing a portion of the insulating layer and a portion of the organic layer, a certain film thickness of the resist can be maintained in forming a resist pattern for removing the insulating layer so that resolution will not be degraded at the time of transferring the pattern.

An particularly notable effect can be expected when the width of the conductive layer is less than 0.5 μm.

Furthermore, as the organic layer includes antireflection material, the resist pattern can be precisely formed.

A method of forming a multi-layer interconnection according to still another aspect of the present invention includes the steps of: removing a portion of a first insulating layer having a main surface and covering a first conductive layer formed on a semiconductor substrate to form in the insulating layer a first hole reaching the first conductive layer; forming an organic layer at least filling the first hole; forming a second insulating layer on the organic layer and the main surface of the first insulating layer; removing a portion of the second insulating layer to form in the second insulating layer a second hole reaching the organic layer filling the first hole; removing the organic layer filling the first hole to communicate the first hole with the second hole; and forming a second conductive layer in such a manner that it fills the first and second holes.

Furthermore, the step of forming the first hole may include forming a resist pattern on the main surface of the first insulating layer and removing the first insulating layer according to the resist pattern.

Furthermore, the step of forming the organic layer may include filling the first hole with an organic layer while forming an organic layer on the main surface of the first insulating layer and then etching-back the organic layer until the main surface of the insulating layer appears.

Furthermore, the step of forming the second hole may include forming a resist pattern on a main surface of the second insulating layer and removing the second insulating layer according to the resist pattern.

Furthermore, the step of forming the second insulating layer preferably includes forming the second insulating layer at a temperature which the organic layer withstands.

Furthermore, the first conductive layer may be at least one component selected from the group consisting of an impurity region formed in the semiconductor substrate and interconnection layers formed on the semiconductor substrate.

Furthermore, the present invention is notably effective when the width of the first and second conductive layers is less than 0.5 μm.

In the method of forming a multi-layer interconnection above, since a first hole reaching a first conductive layer is firstly formed in a first insulating layer and the first hole is filled with an organic layer, a sufficient diameter of the first hole serving as a contact hole can be obtained. Accordingly, increased electric resistance at the connecting portion and defective connection between the first and second interconnection layers can be prevented.

Furthermore, in the step of forming the first hole or in the step of forming the second hole, a certain film thickness of the resist can be maintained in forming a resist pattern for removing the insulating layer so that resolution will not be degraded at the time of transferring the pattern.

A particularly notable effect can be expected when the width of the conductive layer is less than 0.5 μm.

Furthermore, since the second insulating layer is formed at a temperature which the organic layer withstands, the organic layer will not melt when the second insulating layer is formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
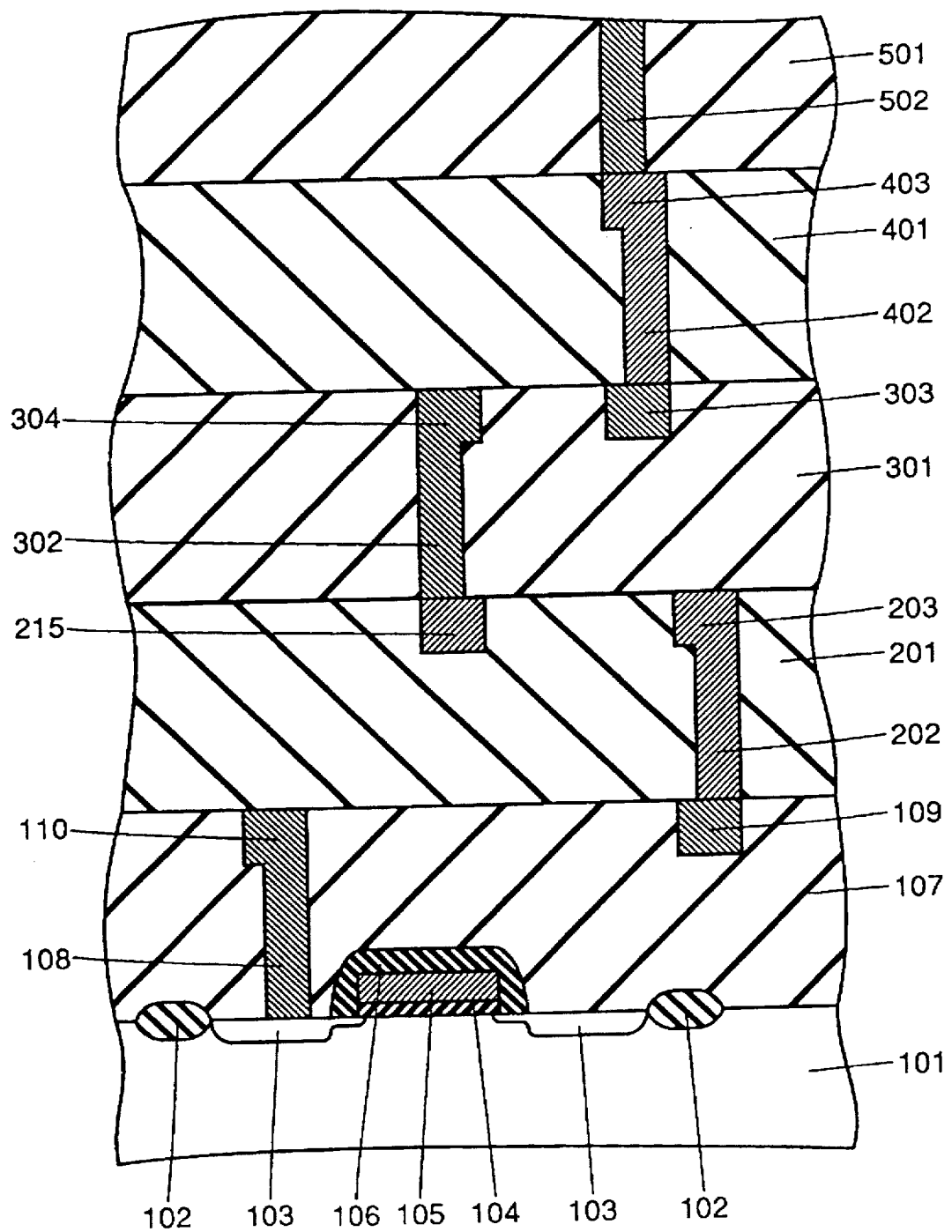
FIG. 1 is a cross sectional view of a multi-layer interconnection structure to which the forming method of the present invention is applied.

Referring to FIG. 1, an element-isolating film 102 is formed on a semiconductor substrate 101. Furthermore, one impurity region 103 and the other impurity region 103 are formed on semiconductor substrate 101 such that they are spaced apart from each other. In a region on semiconductor substrate 101 positioned between one impurity region 103 and the other impurity region 103, a gate electrode 105 is formed with a gate oxide film interposed. An insulating film 106 is formed to cover gate oxide film 104 and gate electrode 105. An interlayer insulating film 107 is formed on semiconductor substrate 101 to cover element-isolating film 102, impurity region 103 and insulating film 106. A surface of interlayer insulating film 107 is planarized. A first interconnection layer 109, 110 is buried in interlayer insulating film 107. The first interconnection layer 110 and impurity region 103 are electrically connected by a connecting portion 108.

Then, a second interlayer insulating film 201 is formed on interlayer insulating film 107. A surface of the second interlayer insulating film 201 is planarized. A second interconnection layer 203, 215 is buried in the second interlayer insulating film 201. The second interconnection layer 203 and the first interconnection layer 109 are electrically connected by a connecting portion 202. An upper layer is similarly structured.

The forming method of the present invention will now be described in the embodiments of the present invention with reference to the case in which the method is applied to the connection between the first interconnection layer 109 and the second interconnection layer 203 shown in FIG. 1.

[First Embodiment]

Figure 2:
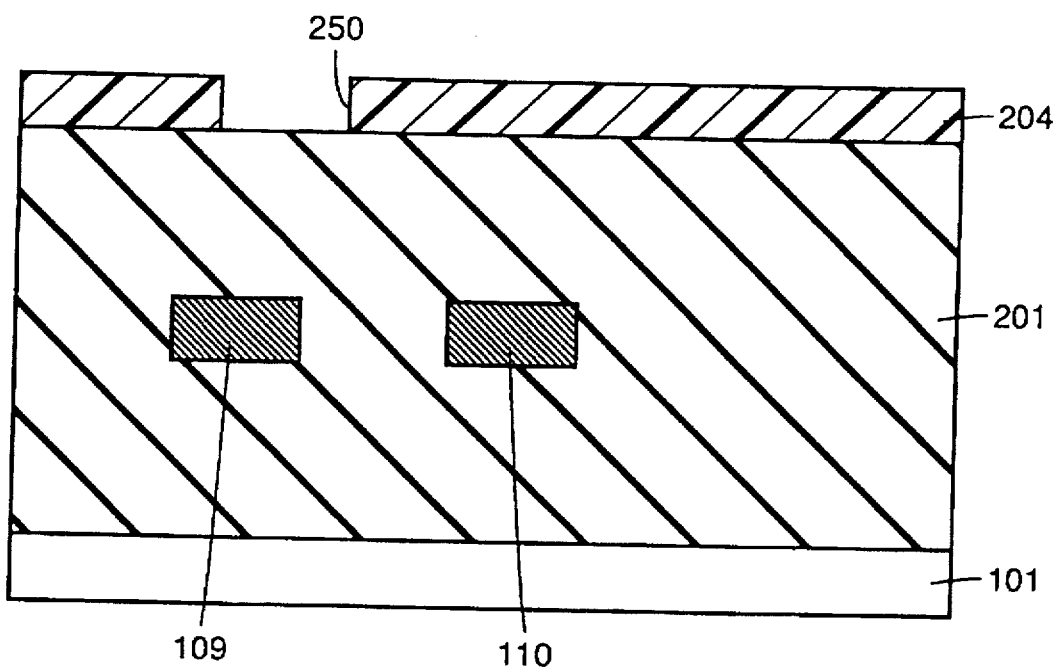
FIGS. 2–9 are cross sectional views illustrating the first to eighth steps of the method of forming a multi-layer interconnection according to a first embodiment of the present invention, respectively.

Referring to FIG. 2, an interlayer insulating film 201 is formed on a semiconductor substrate 101. A first interconnection layer 109, 110 is buried in interlayer insulating film 201. Semiconductor substrate 101 herein corresponds to semiconductor substrate 101 of FIG. 1. Interlayer insulating film 201 corresponds to interlayer insulating film 201 of FIG. 1. The first interconnection layer 109, 110 corresponds to interconnection layer 109, 110 of FIG. 1. The first interconnection layer 110, 109 is covered with interlayer insulating film 107 in FIG. 1, while it is covered with interlayer insulating film 201 herein. A surface of interlayer insulating film 201 is planarized. A resist pattern 204 for a contact hole having a hole 250 is formed on the surface of interlayer insulating film 201 by photolithography.

Figure 3:
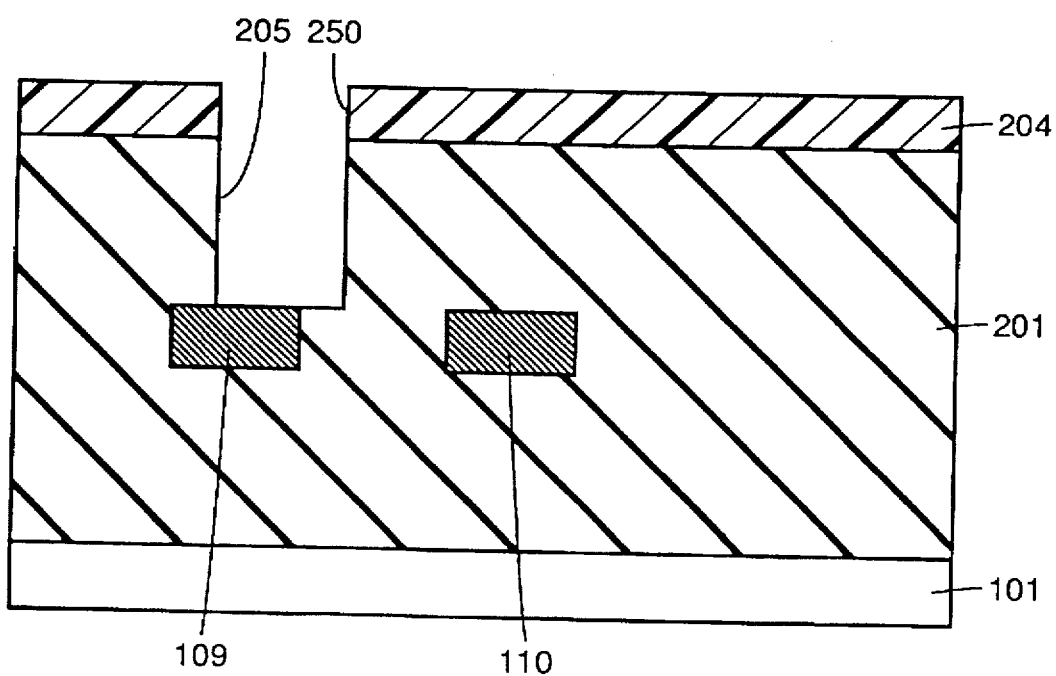

Referring to FIG. 3, resist pattern 204 is used as a mask and interlayer insulating film 201 is dry-etched to form a contact hole 205 such that its bottom wall may reach the first interconnection layer 109. The diameter of contact hole 205 is adapted to be approximately equal to that of hole 250.

Figure 4:
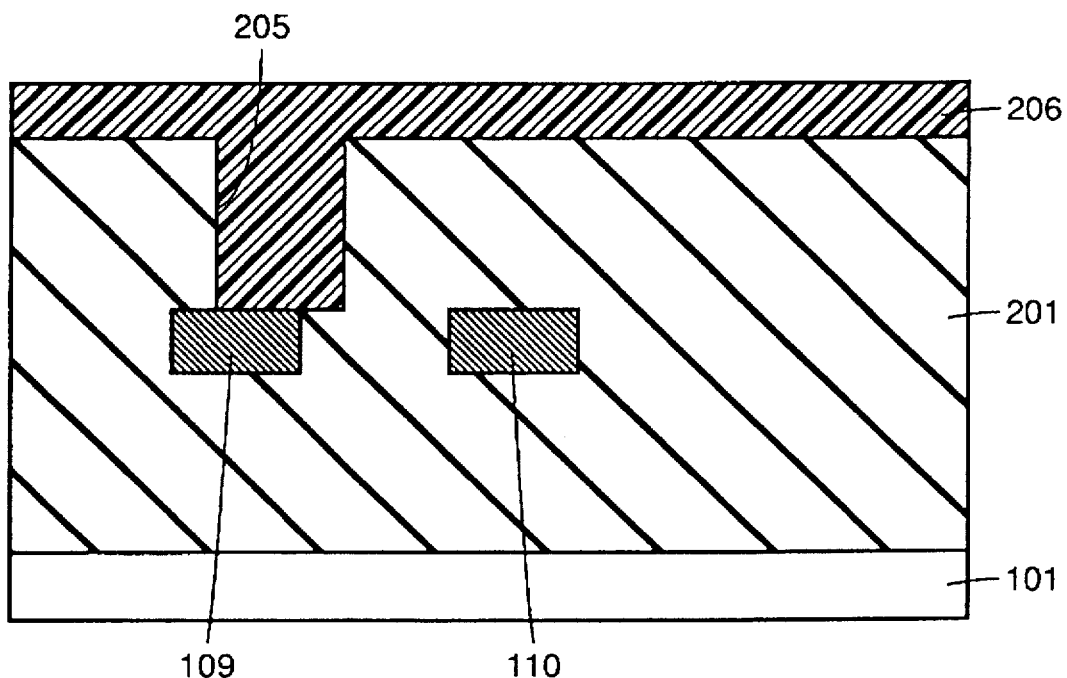

Referring to FIG. 4, an organic material 206 is applied by a coater such that it fills contact hole 205 and covers the entire surface of interlayer insulating film 201.

Figure 5:
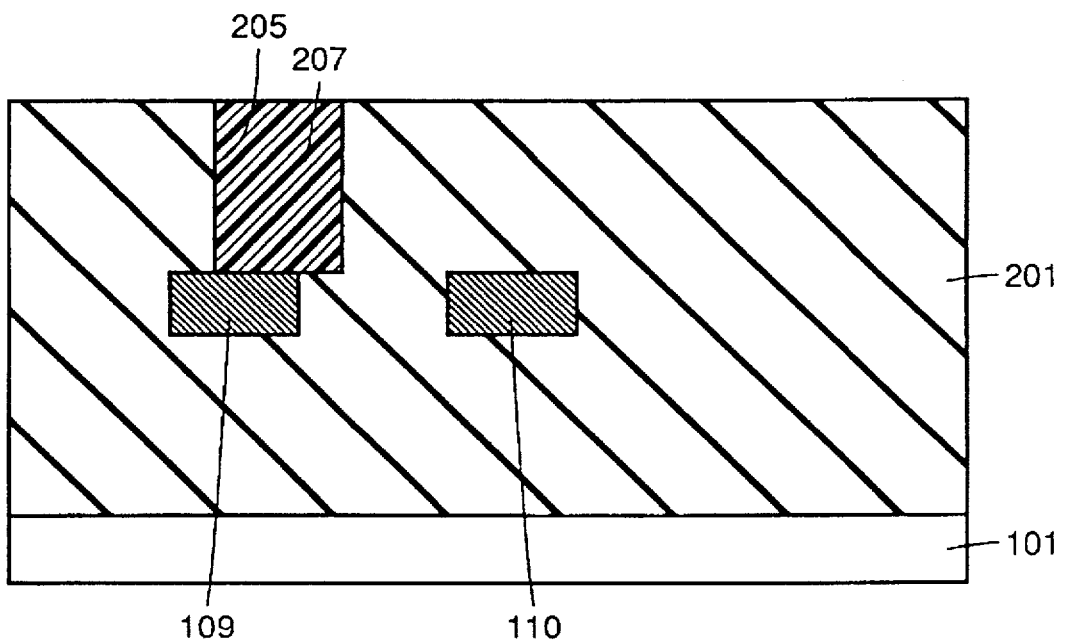

Referring to FIG. 5, organic material 206 is etched back to form a buried portion 207, which is contact hole 205 filled with organic material. Interlayer insulating film 201 surface can be made almost level with a surface of buried portion 207 formed of organic material.

Figure 6:
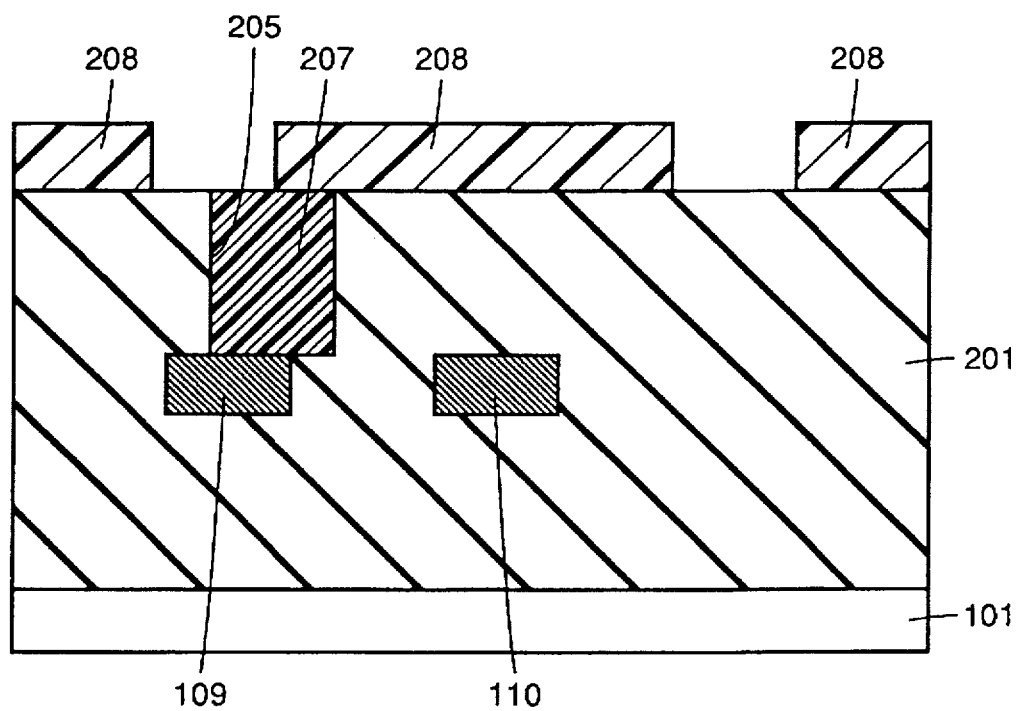

Referring to FIG. 6, a resist pattern 208 of a hole for an interconnection layer is formed on surfaces of interlayer insulating film 201 and buried portion 207. As interlayer insulating film 201 surface is almost level with buried portion 207 surface, resist pattern 208 has an almost uniform film thickness. This allows resist pattern 208 to be formed precisely.

Figure 7:
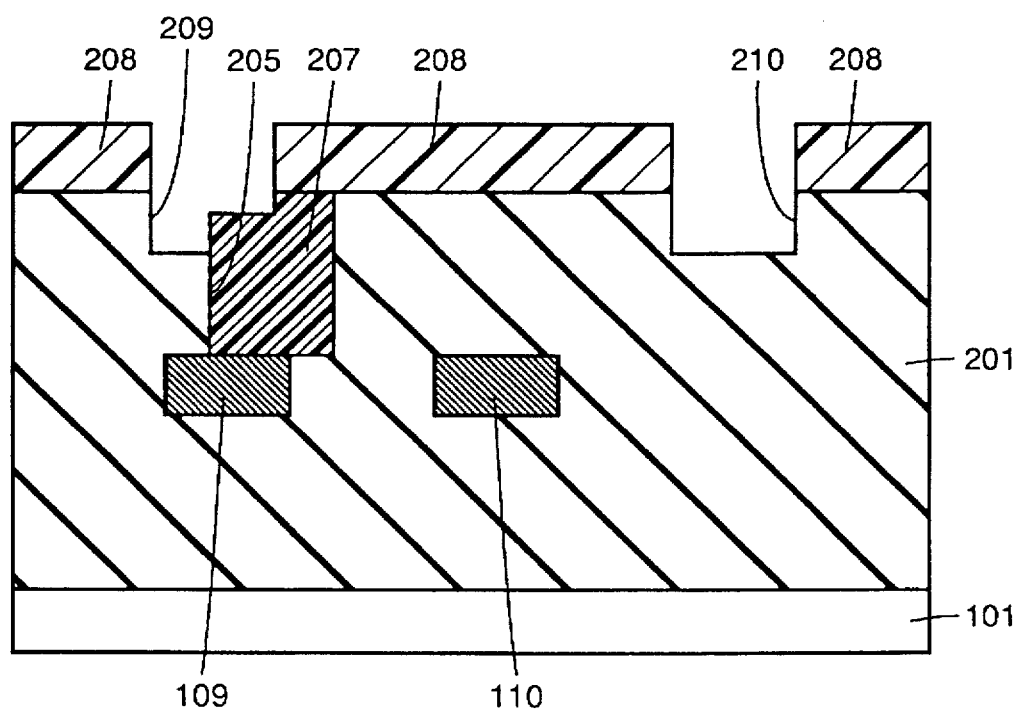

Referring to FIG. 7, resist pattern 208 is used as a mask and interlayer insulating film 201 and buried portion 207 are dry-etched to form a hole 209, 210 for an interconnection layer.

Figure 8:
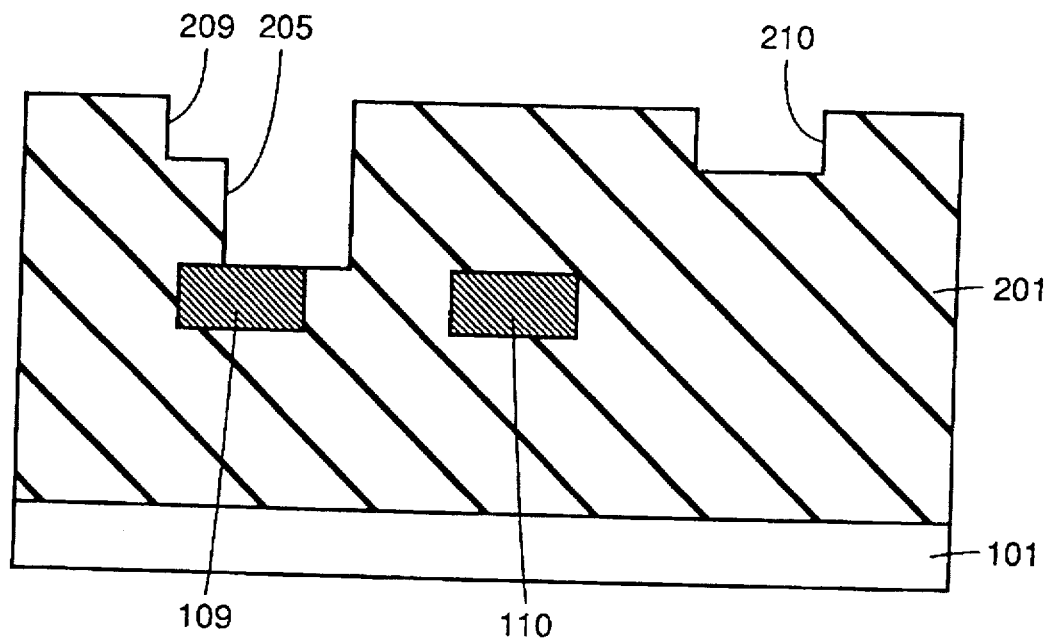

Referring to FIG. 8, buried portion 207 formed of organic material and resist pattern 208 of the hole for the interconnection layer are removed by ashing to open hole 209, 210 for the interconnection layer and contact hole 205.

Figure 9:
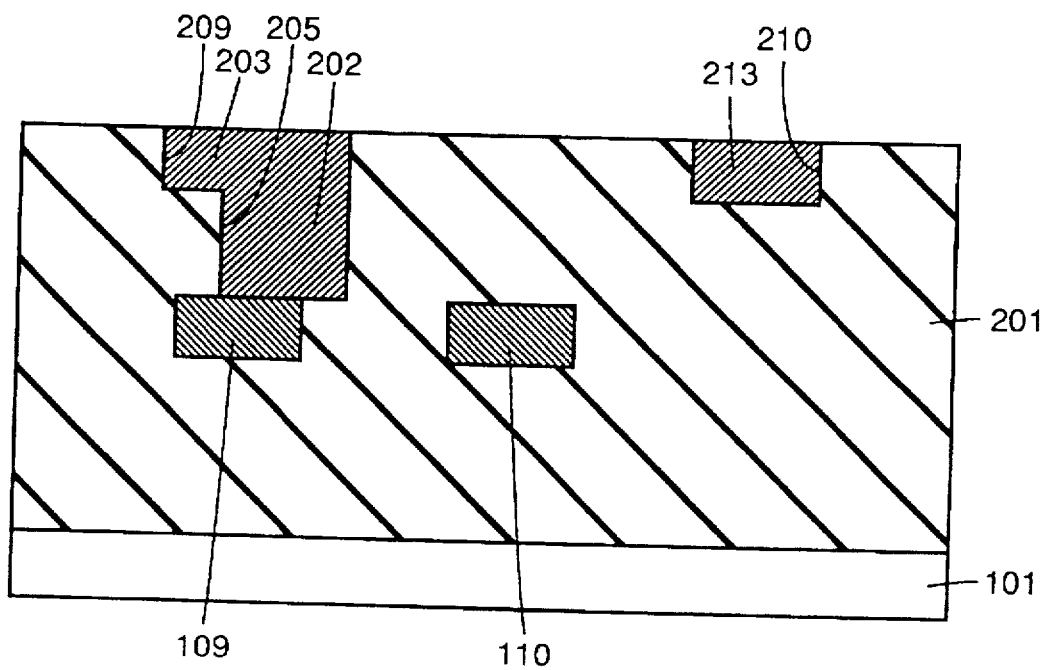

Referring to FIG. 9, contact hole 205 and hole 209, 210 are filled with a metal film to form a connecting portion 202 and a second interconnection layer 203, 213.

In the method of forming a multi-layer interconnection above, since the diameter of contact hole 205 can be made almost equal to that of hole 250 of resist pattern 204 in the step shown in FIG. 3, such problems as increased electric resistance at the connecting portion and defective connection between the first and second interconnection layers due to a reduced diameter of connecting portion 202 can be solved. Furthermore, in the step shown in FIG. 5, interlayer insulating film 201 surface can be made almost level with the surface of buried portion 207 formed of organic material. This allows resist pattern 208 for the second interconnection layer to be precisely formed even exactly on contact hole 205 as shown in FIG. 6.

[Second Embodiment]

Figure 10:
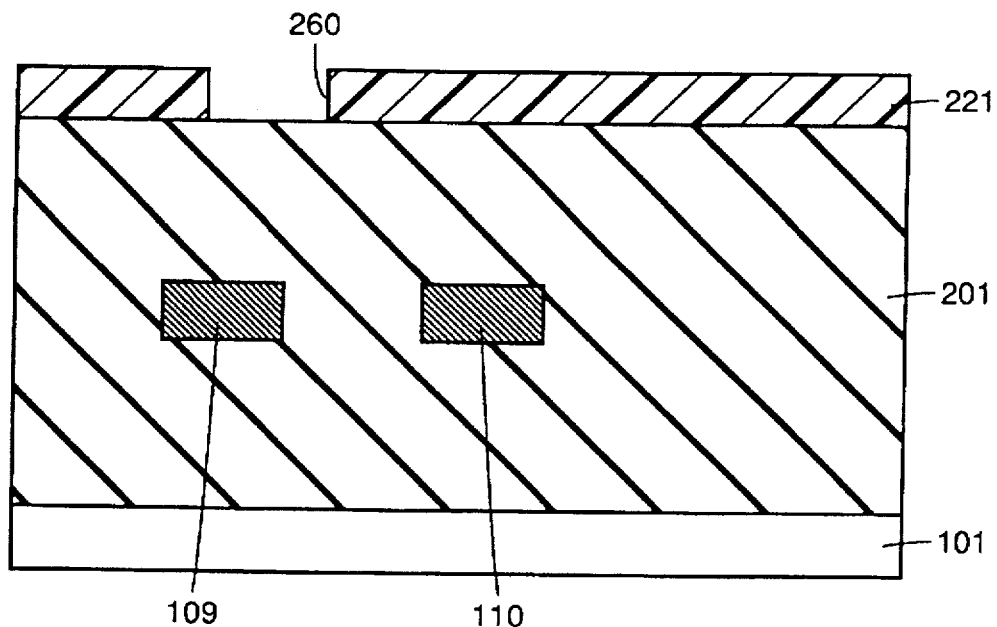
FIGS. 10–17 are cross sectional views illustrating the first to eighth steps of the method of forming a multi-layer interconnection according to a second embodiment of the present invention, respectively.

Referring to FIG. 10, interlayer insulating film 201 is formed on semiconductor substrate 101. The first interconnection layer 109, 110 is buried in interlayer insulating film 201. Semiconductor substrate 101 herein corresponds to semiconductor substrate 101 of FIG. 1. Interlayer insulating film 201 corresponds to interlayer insulating film 201 of FIG. 1. The first interconnection layer 109, 110 corresponds to the first interconnection layer 109, 110 of FIG. 1. The first interconnection layer 110, 109 herein is covered with interlayer insulating film 201, while the first interconnection layer 110, 109 of FIG. 1 is covered with interlayer insulating film 107. A surface of interlayer insulating film 201 is planarized. A resist pattern 221 having a hole 260 is formed on the surface of interlayer insulating film 201 by photolithography.

Figure 11:
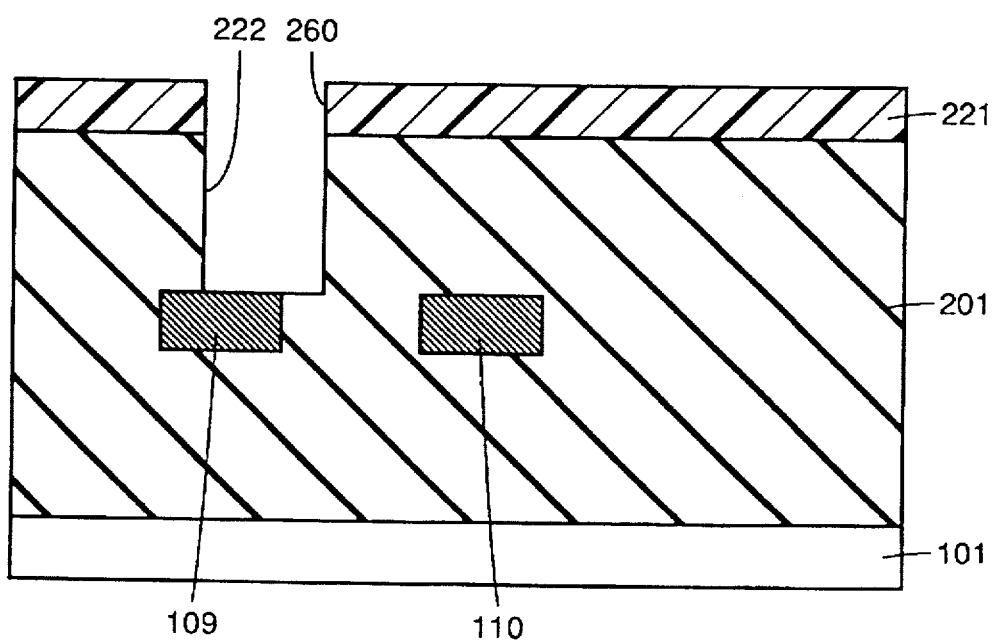

Referring to FIG. 11, resist pattern 221 is used as a mask and interlayer insulating film 201 is dry-etched to form a contact hole 222 such that its bottom wall may reach the first interconnection layer 109. The diameter of contact hole 222 is adapted to be almost equal to that of hole 260.

Figure 12:
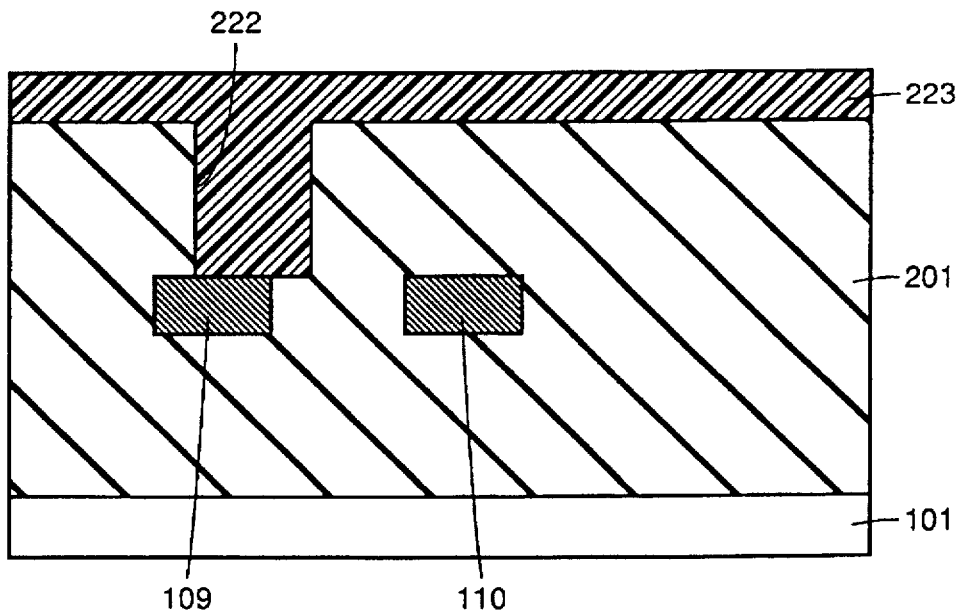

Referring to FIG. 12, an organic material 223 including antireflection material is applied by a coater such that it fills contact hole 222 and covers the entire surface of interlayer insulating film 201.

Figure 13:
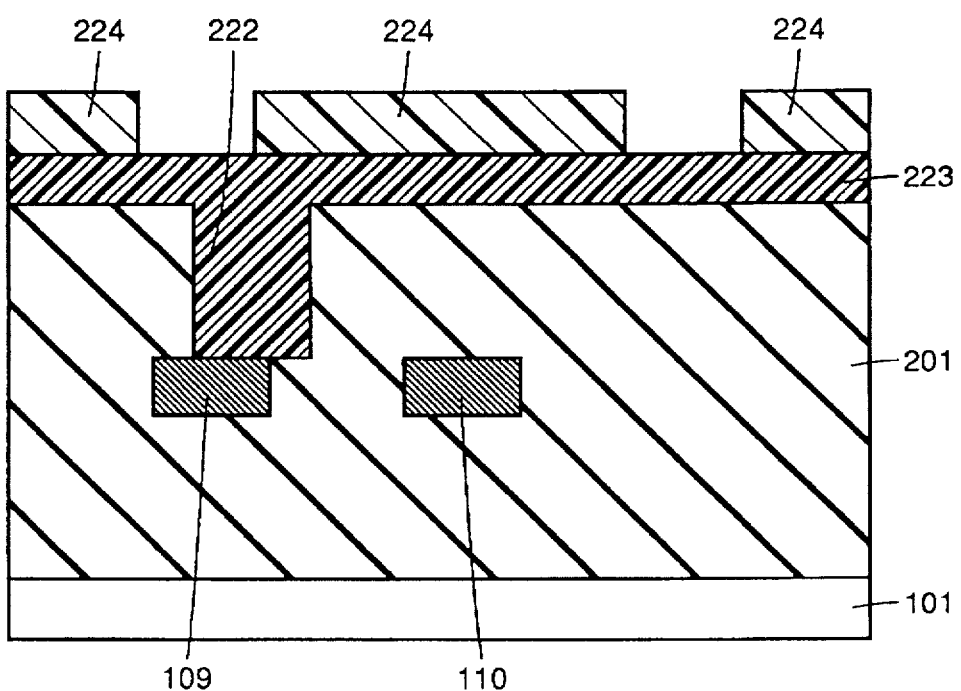

Referring to FIG. 13, a resist pattern 224 of a hole for an interconnection layer is formed on a surface of organic material 223. The thickness of resist pattern 224 is almost uniform since the surface of organic material 223 is nearly uniform.

Figure 14:
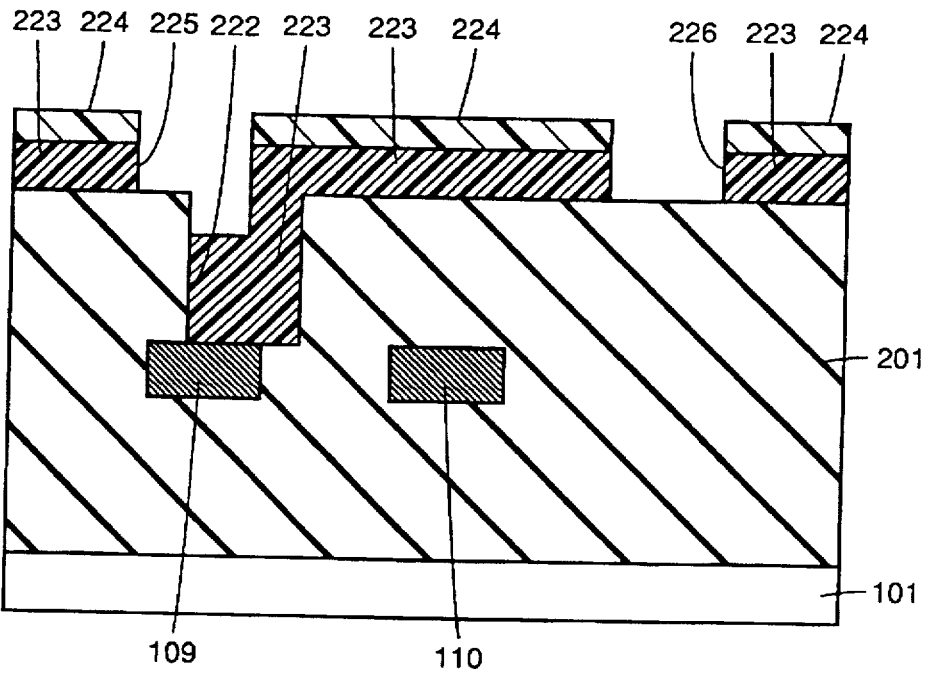

Referring to FIG. 14, resist pattern 224 is used as a mask and organic material 223 is dry-etched to form a hole 225, 226 for a second interconnection layer.

Figure 15:
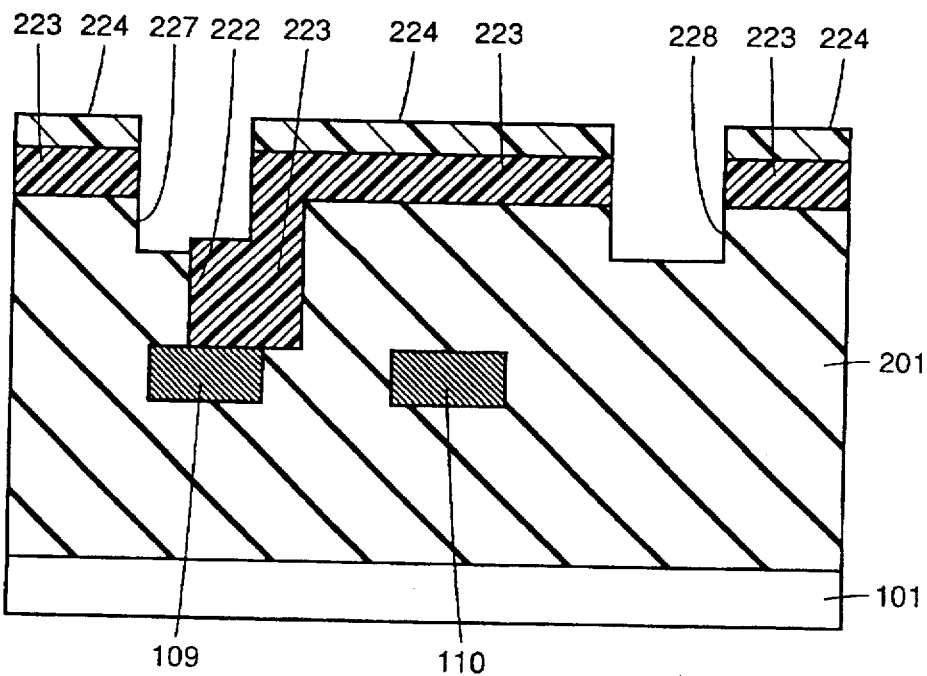

Referring to FIG. 15, resist pattern 224 is used as a mask and interlayer insulating film 201 is dry-etched to form a hole 227, 228 for the interconnection layer.

Figure 16:
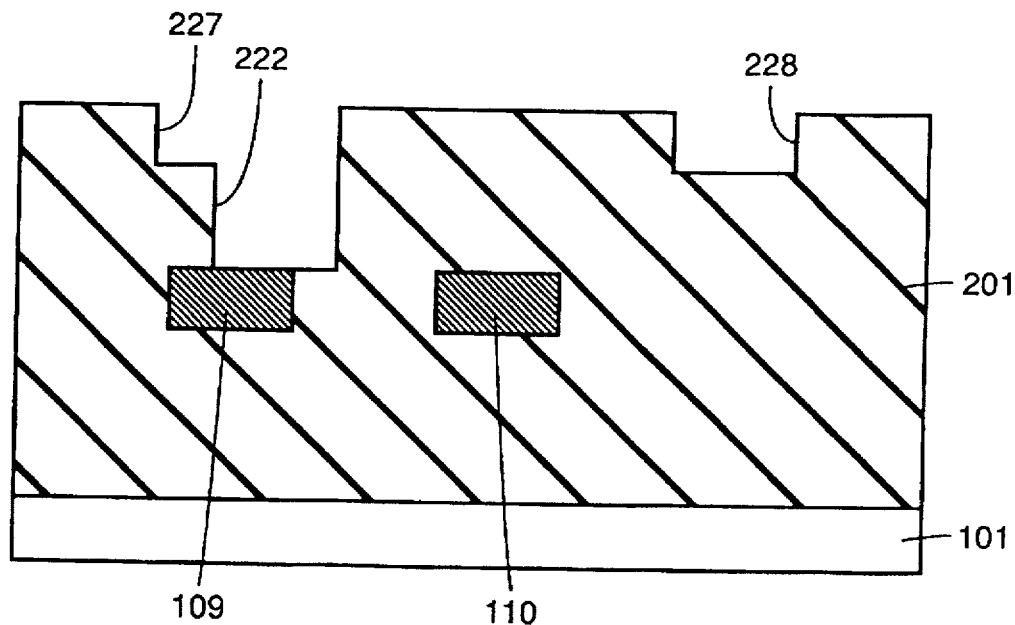

Referring to FIG. 16, organic material 223 and resist pattern 224 are removed by ashing to open hole 227, 228 and contact hole 222.

Figure 17:
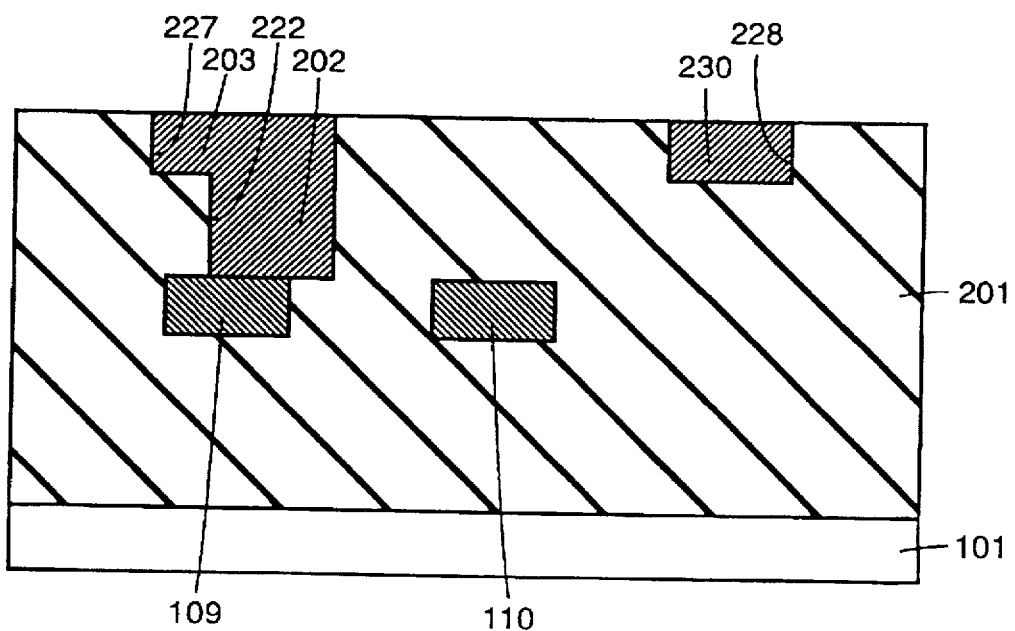

Referring to FIG. 17, contact hole 222 and hole 227, 228 are filled with a metal film to form connecting portion 202 and the second interconnection layer 203, 230.

In the method of forming a multi-layer interconnection above, since the diameter of contact hole 222 can be made almost equal to that of hole 260 of resist pattern 221 in the step shown in FIG. 11, such problems as increased electric resistance at connecting portion 202 and defective connection between the first and second interconnection layers due to a reduced diameter of connecting portion 202 can be solved. Furthermore, in the step shown in FIG. 13, since the level of organic material 223 surface is nearly uniform, the thickness of resist pattern 224 will be nearly uniform. Also, since organic material 223 includes antireflection material, resist pattern 224 can be formed precisely.

[Third Embodiment]

Figure 18:
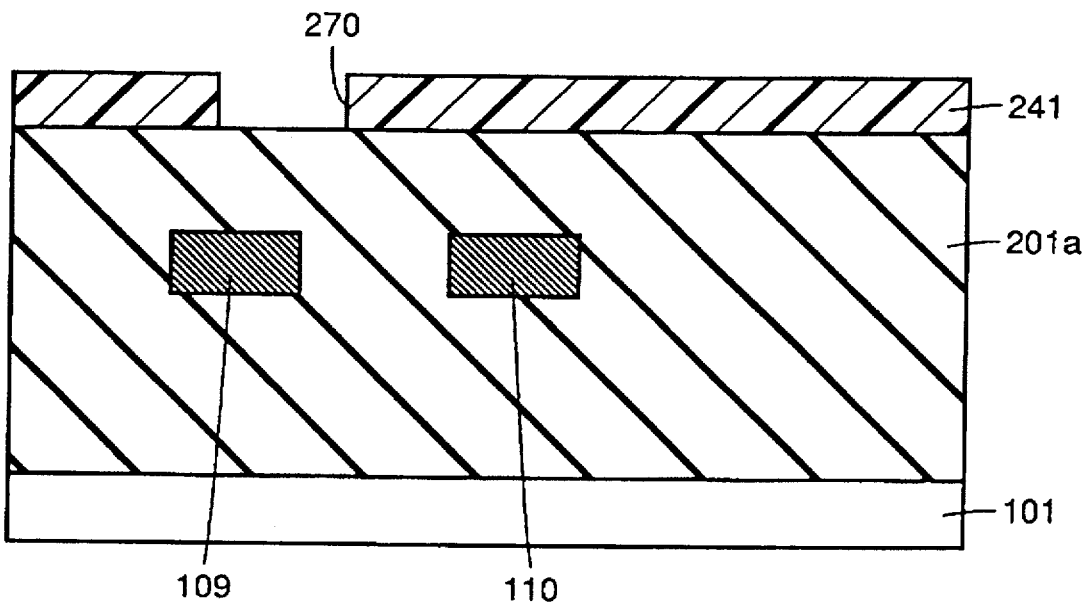
FIGS. 18–24 are cross sectional views illustrating the first to seventh steps of the method of forming a multi-layer interconnection according to a third embodiment of the present invention, respectively.

Referring to FIG. 18, an interlayer insulating film 201a is formed on semiconductor substrate 101. The first interconnection layer 109, 110 is buried in interlayer insulating film 201a. Semiconductor substrate 101 herein corresponds to semiconductor substrate 101 of FIG. 1. Interlayer insulating film 201a is part of interlayer insulating film 201 of FIG. 1. The first interconnection layer 109, 110 corresponds to the first interconnection layer 109, 110 of FIG. 1. The first interconnection layer 109 herein is covered with interlayer insulating film 201a, while the first interconnection layer 109 in FIG. 1 is covered with interlayer insulating film 107. A surface of interlayer insulating film 201a is planarized. Interlayer insulating film 201a is thinner than interlayer insulating film 201 of FIG. 1. A resist pattern 241 of the contact hole having a hole 270 is formed on interlayer insulating film 201a by photolithography.

Figure 19:
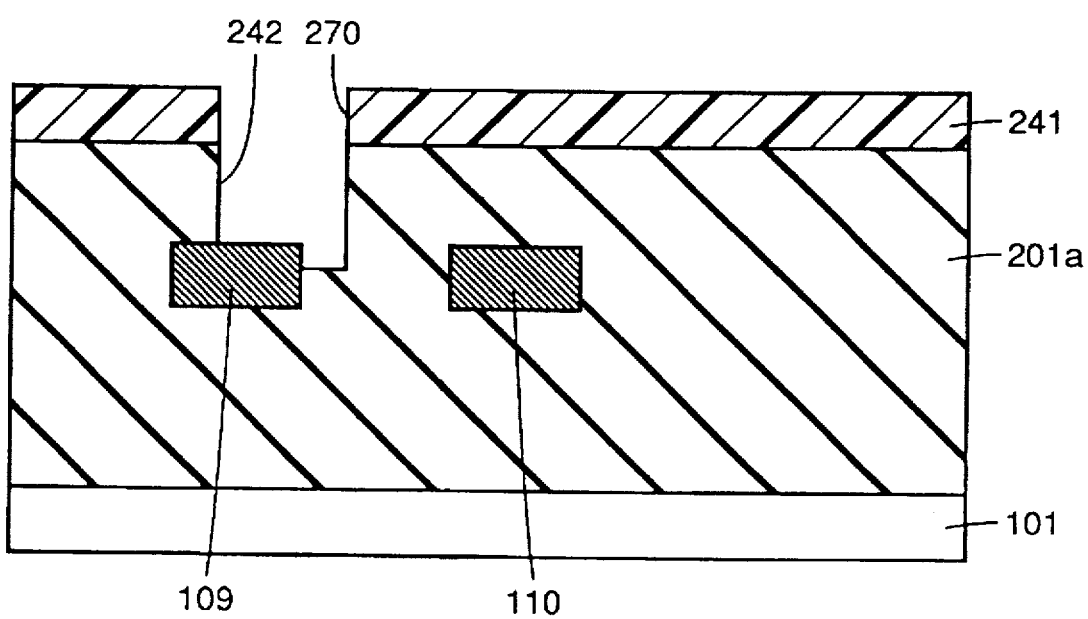

Referring to FIG. 19, resist pattern 241 is used as a mask and interlayer insulating film 201a is dry-etched to form a contact hole 242 such that its bottom wall may reach the first interconnection layer 109. The diameter of contact hole 242 is adapted to be almost equal to that of hole 270.

Furthermore, as the distance from interlayer insulating film 201a surface to the first interconnection layer 109 is shorter than the distance from interlayer insulating film 201 surface to the first interconnection layer 109 shown in FIG. 1, contact hole 242 can be easily formed.

Figure 20:
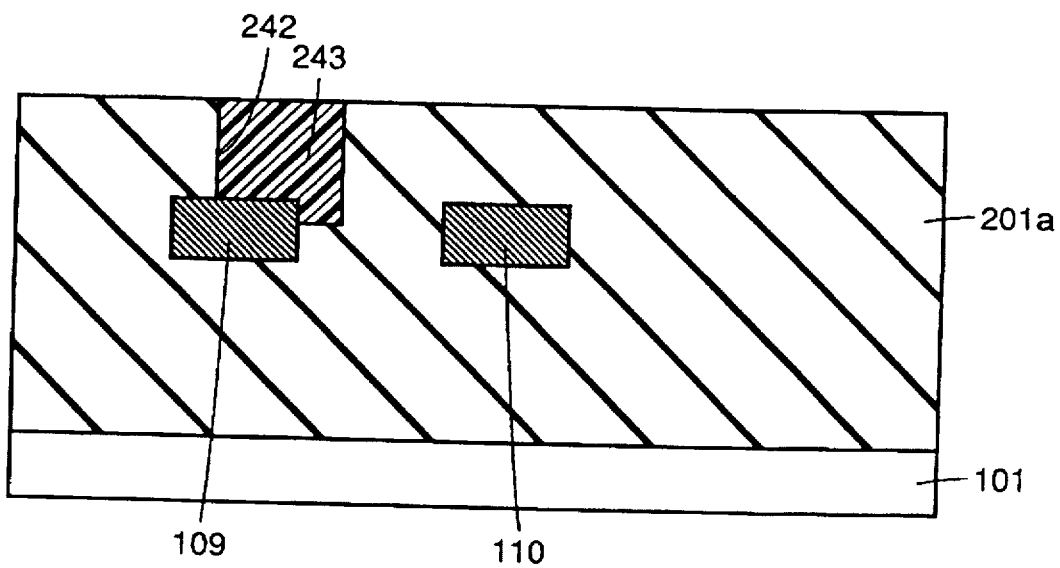

Referring to FIG. 20, organic material is applied by a coater such that it fills contact hole 242 and covers the entire surface of interlayer insulating film 201a. Then, the organic material is etched back until the surface of interlayer insulating film 201a is exposed to form a buried portion 243, which is contact hole 242 filled with the organic material. Interlayer insulating film 201a has its surface adapted to be nearly level with a surface of buried portion 243 formed of the organic material.

Figure 21:
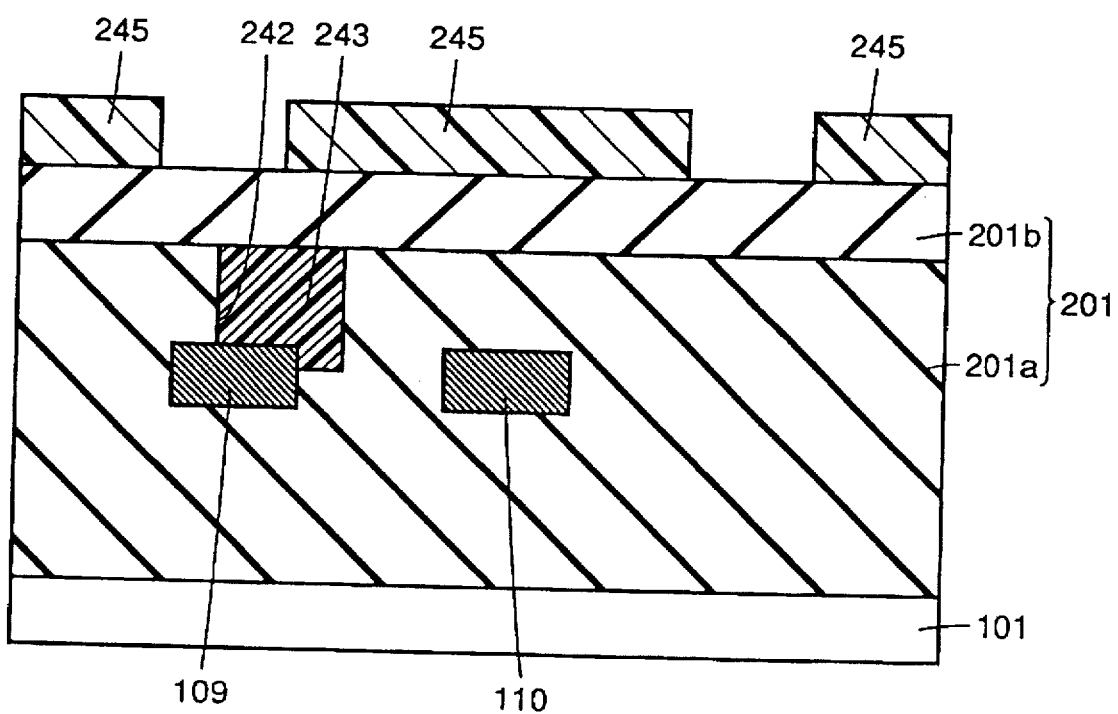

Referring to FIG. 21, an interlayer insulating film 201b is formed on interlayer insulating film 201a surface and on buried portion 243 surface at a temperature which the organic material forming buried portion 243 withstands. Interlayer insulating films 201a and 201b correspond to interlayer insulating film 201 of FIG. 1. Then, a resist pattern 245 of a hole for an interconnection layer is formed on a surface of interlayer insulating film 201b. As interlayer insulating film 201b surface is almost planarized, resist pattern 245 will have an almost uniform thickness. Accordingly, resist pattern 245 can be formed precisely.

Figure 22:
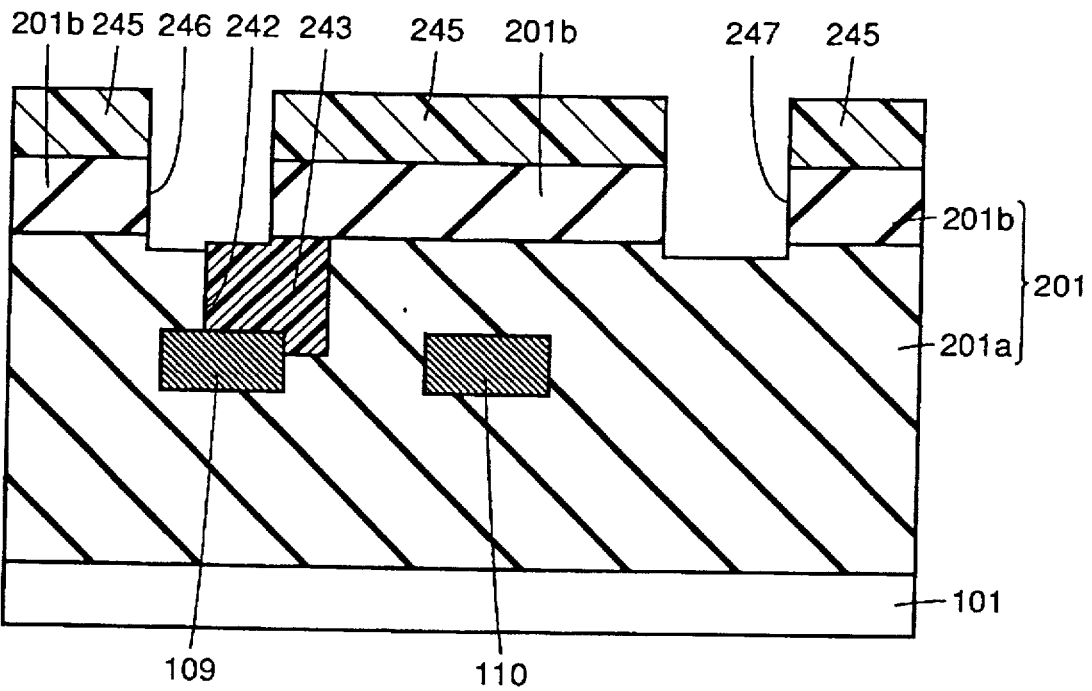

Referring to FIG. 22, resist pattern 245 is used as a mask and interlayer insulating films 201a, 201b are dry-etched to form a hole 246, 247 for the interconnection layer.

Figure 23:
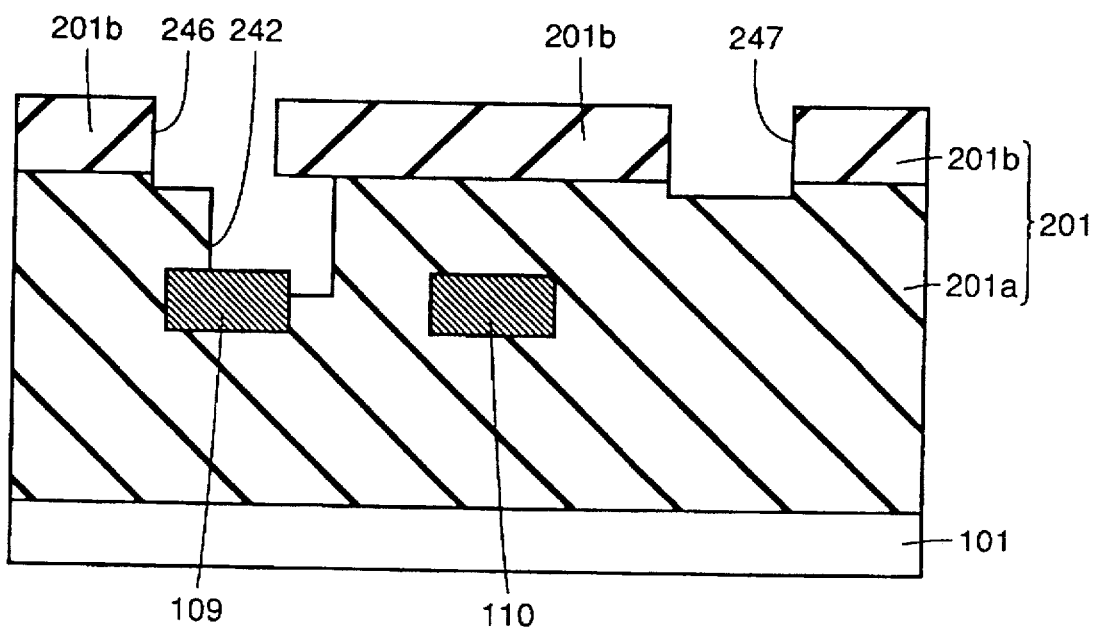

Referring to FIG. 23, buried portion 243 formed of the organic material and resist pattern 245 are removed by ashing to open hole 246, 247 and contact hole 242.

Figure 24:
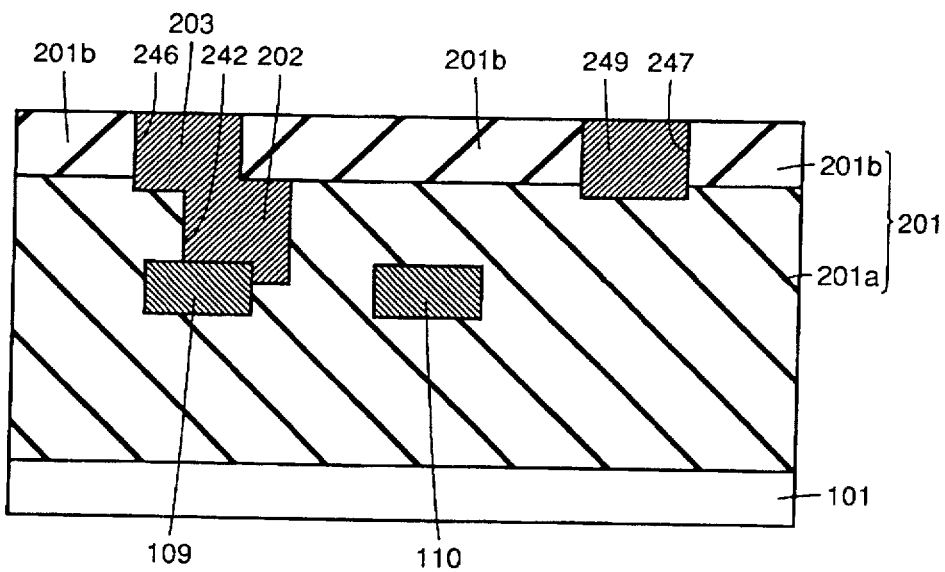
Figure 25:
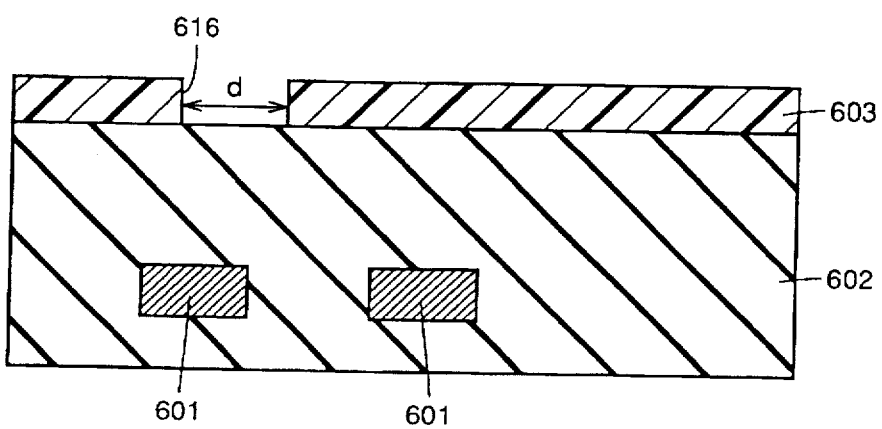
FIGS. 25–33 are cross sectional views illustrating the first to ninth steps of a conventional method of forming a multi-layer interconnection, respectively.
Figure 26:
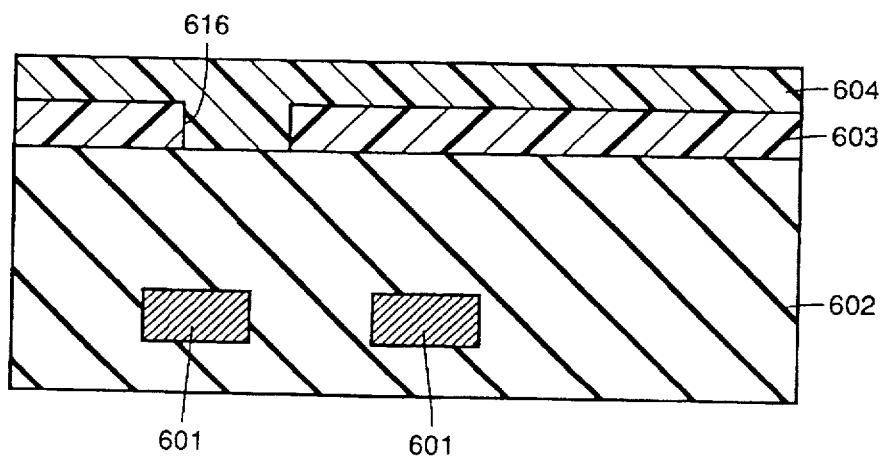
Figure 27:
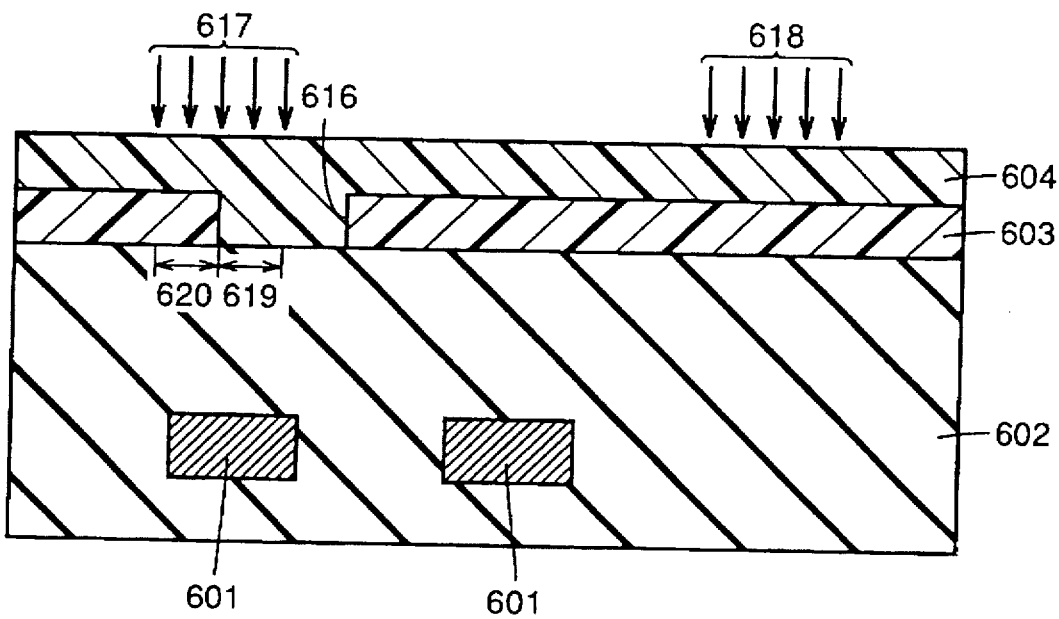
Figure 28:
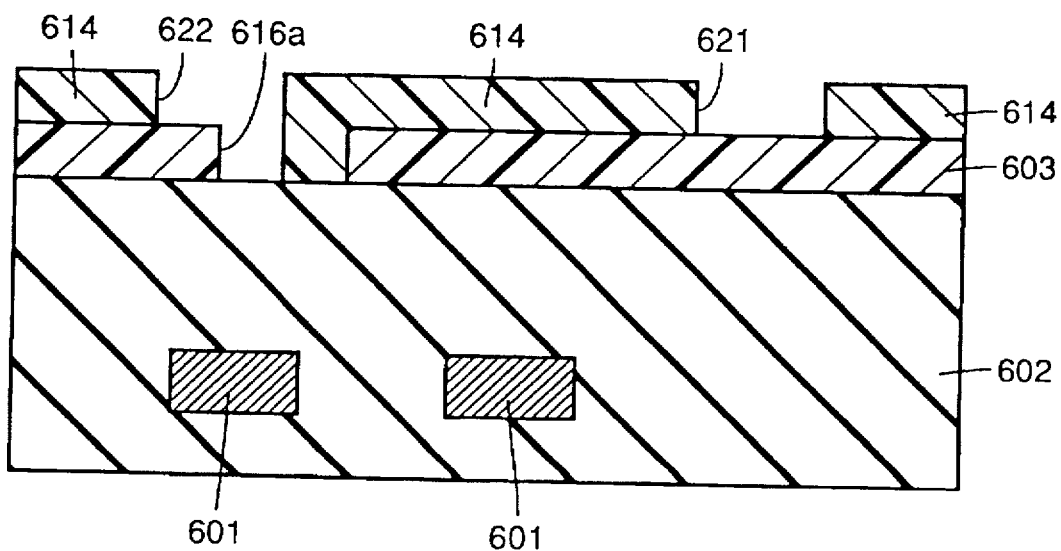
Figure 29:
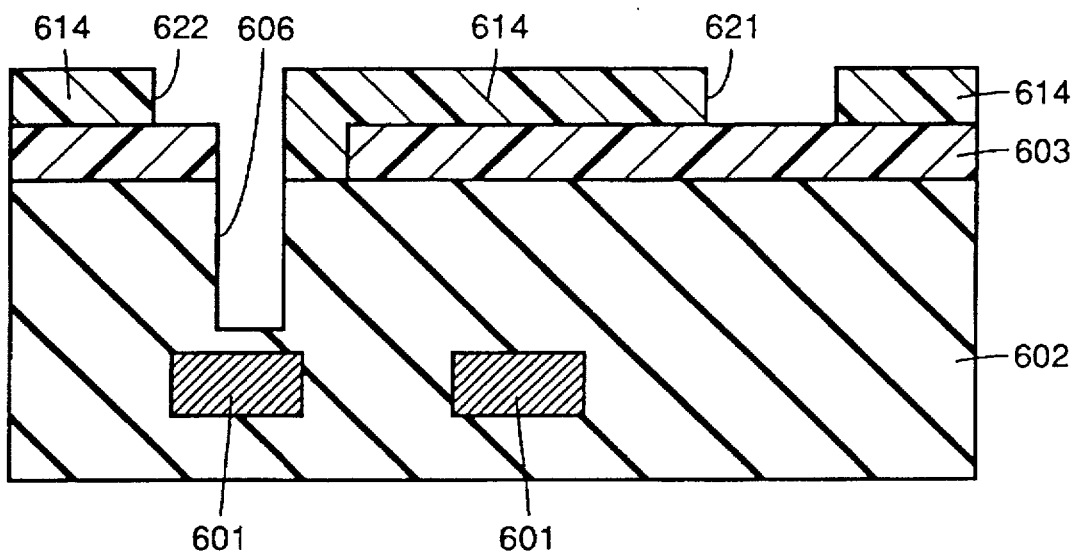
Figure 30:
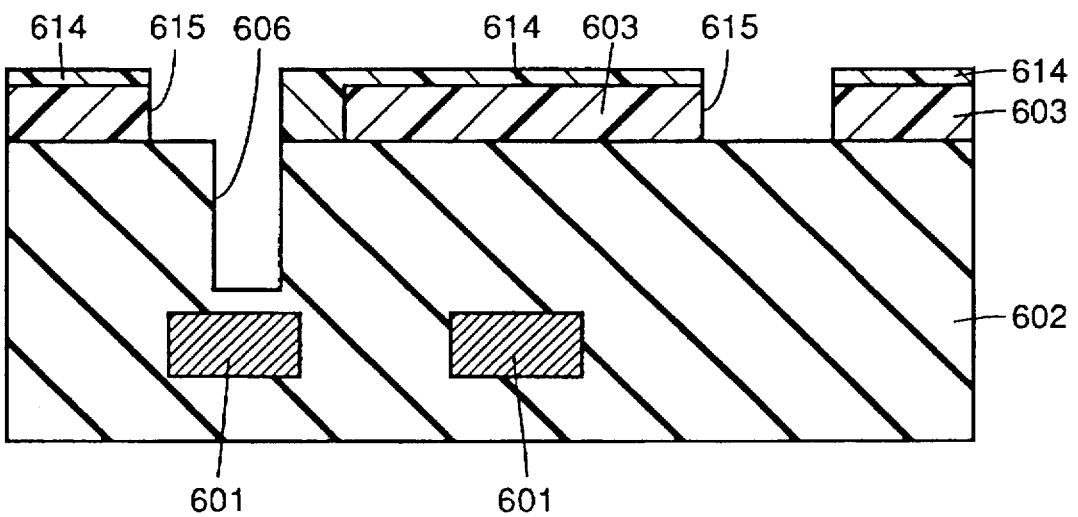
Figure 31:
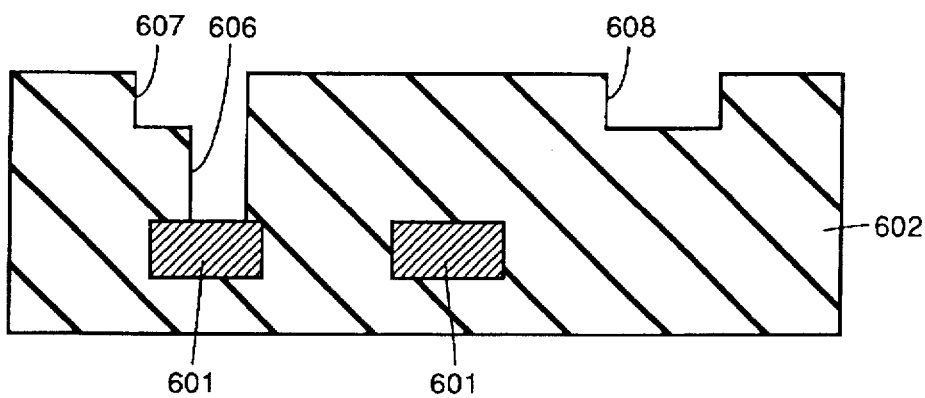
Figure 32:
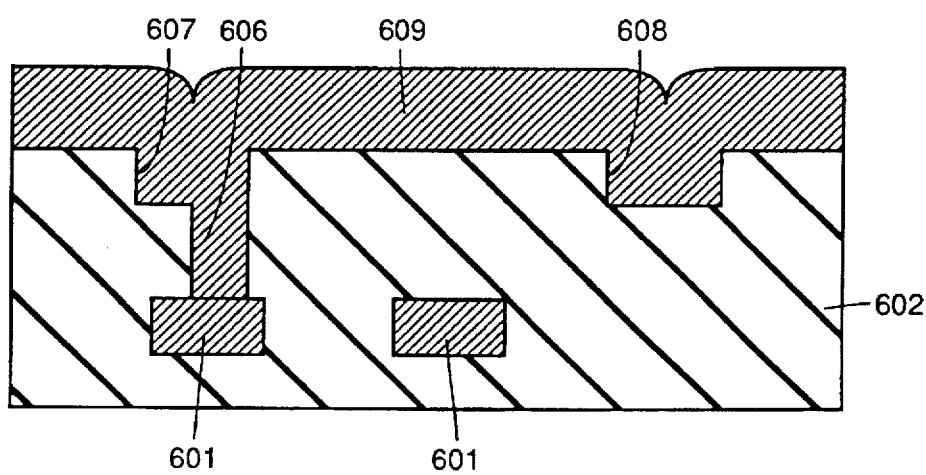
Figure 33:
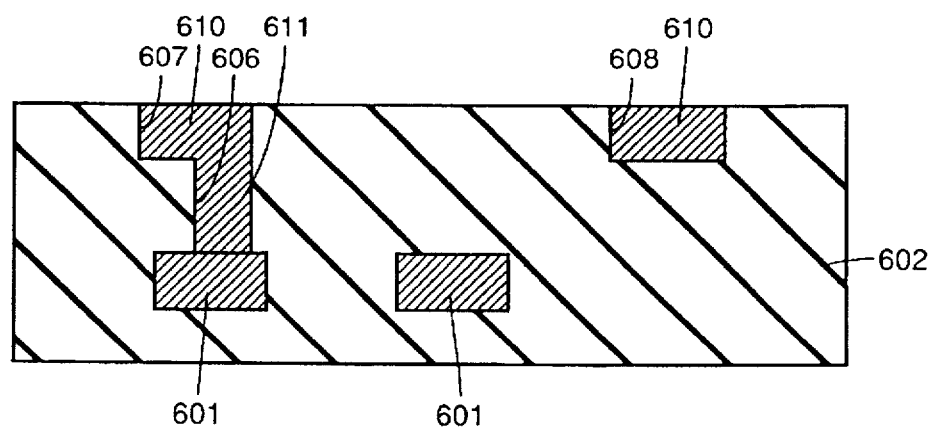

Referring to FIG. 24, contact hole 242 and hole 246, 247 are filled with a metal film to form connecting portion 202 and the second interconnection layer 203, 249.

In the method of forming a multi-layer interconnection above, since the diameter of contact hole 242 can be made almost equal to that of hole 270 of resist pattern 241 in the step shown in FIG. 19, such problems as increased electric resistance at connecting portion 202 and defective connection between the first and second interconnection layers due to a reduced diameter of connecting portion 202 can be solved. Furthermore, in the step shown in FIG. 21, interlayer insulating film 201b surface is nearly planarized. Therefore, the thickness of resist pattern 245 can be made uniform so that resist pattern 245 can be formed precisely.

As mentioned earlier, the first interconnection layer 109 and the second interconnection layer 203 of the first to third embodiments described with reference to the figures correspond to the first interconnection layer 109 and the second interconnection layer 203 of FIG. 1, respectively. However, the first interconnection layer 109 and the second interconnection layer 203 of those embodiments may correspond to impurity region 103 and the first interconnection layer 110 of FIG. 1, respectively. Furthermore, the first interconnection layer 109 and the second interconnection layer 203 of the embodiments may correspond to interconnection layer 303, 215 and interconnection layer 403, 304, respectively.

Furthermore, the diameter of the connecting portion formed by the method of forming a multi-layer interconnection of the present invention hardly has an error. Thus, a particularly notable effect can be obtained when the diameter of the connecting portion is less than 0.5 μm, that is, when the width of the first and second interconnection layers is less than 0.5 μm.

(EXAMPLES)

Examples of the present invention will now be described with reference to the figures. First to third examples correspond to the first to third embodiments, respectively.

(First Example)

Based on FIGS. 2–9, the method of forming a multi-layer interconnection according to the first embodiment of the present invention will be described.

Referring to FIG. 2, interlayer insulating film 201 including a silicon oxide film is formed on semiconductor substrate 101 of silicon. Buried in interlayer insulating film 201 is the first interconnection layer 109, 110 having a width of 0.3 μm formed of aluminum containing 0.5% by weight of copper. Interlayer insulating film 201 surface is planarized. Resist including naphthoquinone diazide photosensitive material and novolak resin is applied on the surface of interlayer insulating film 201 and resist pattern 204 with hole 250 having a diameter of 0.3 μm is formed by photolithography.

Referring to FIG. 3, resist pattern 204 is used as a mask and interlayer insulating film 201 is etched by reactive ions in a mixed gas of $CHF_3$ and $O_2$ to form contact hole 205 such that its bottom wall may reach the first interconnection layer 109.

Referring to FIG. 4, organic material 206 including novolak resin is applied by coater.

Referring to FIG. 5, organic material 206 is etched back by reactive ions in $O_2$ gas to form buried portion 207, which is contact hole 205 filled with organic material 206. The surface of interlayer insulating film 201 and the surface of buried portion 207 formed of the organic material are made nearly level with each other.

Referring to FIG. 6, resist including naphthoquinone diazide photosensitive material and novolak resin is applied on interlayer insulating film 201 surface and on buried portion 207 surface and resist pattern 208 of a hole for an interconnection layer is formed by photolithography. As interlayer insulating film 201 surface and buried portion 207 surface are almost level with each other, the thickness of resist pattern 208 is almost uniform. This allows resist pattern 208 to be formed precisely.

Referring to FIG. 7, resist pattern 208 is used as a mask and interlayer insulating film 201 and buried portion 207 are etched by reactive ions in a mixed gas of $CHF_3$ and $O_2$ to form hole 209, 210 for the interconnection layer.

Referring to FIG. 8, the novolak resin of buried portion 207 is reacted with $O_2$ plasma to open hole 209, 210 and contact hole 205.

Referring to FIG. 9, contact hole 205 and hole 209, 210 are filled with aluminum containing 0.5% by weight of copper to form connecting portion 202 and the second interconnection layer 203, 213.

In the first example, connecting portion 202 having a diameter of approximately 0.3 μm is obtained. Furthermore, such problems as increased electric resistance in connecting portion 202 and defective connection between the first interconnection layer 109 and the second interconnection layer 203 did not occur.

(Second Example)

Referring to FIGS. 10–17, the method of forming a multi-layer interconnection according to a second example of the present invention will be described.

Referring to FIG. 10, interlayer insulating film 201 including a silicon oxide film is formed on semiconductor substrate 101 consisting of silicon. Buried in interlayer insulating film 201 is the first interconnection layer 109, 110 having a diameter of 0.3 μm forming of aluminum containing 0.5% by weight of copper. Interlayer insulating film 201 surface is planarized. Resist containing naphthoquinone diazide photosensitive material and novolak resin is applied on interlayer insulating film 201 surface and resist pattern 221 of the contact hole with hole 260 having a diameter of 0.3 μm is formed by photolithography.

Referring to FIG. 11, resist pattern 221 is used as a mask and interlayer insulating film 201 is etched by reactive ions in a mixed gas of $CHF_3$ and $O_2$ to form contact hole 222 such that its bottom wall reaches the first interconnection layer 109.

Referring to FIG. 12, organic material 223 containing BARLi (trade name) manufactured by Hoechst AG is applied by coater such that it fills contact hole 222 and covers the entire surface of interlayer insulating film 201.

Referring to FIG. 13, resist containing naphthoquinone diazide photosensitive material and novolak resin is applied on organic material 223 surface and resist pattern 224 of a hole for the interconnection layer is formed by photolithography. As organic material 223 surface is almost planarized, the thickness of resist pattern 224 is nearly uniform. Furthermore, since BARLi contained in organic material 223 contains antireflection material, it is possible to form resist pattern 224 precisely.

Referring to FIG. 14, resist pattern 224 is used as a mask and organic material 223 is etched by reactive ions in $O_2$ gas to form hole 225, 226 for the second interconnection layer.

Referring to FIG. 15, resist pattern 224 is used as a mask and interlayer insulating film 201 is etched by reactive ions in a mixed gas of $O_2$ and $N_2$ to form hole 227, 228 for the interconnection layer.

Referring to FIG. 16, the novolak resin of resist pattern 224 and the BARLi of organic material 223 are reacted with $O_2$ plasma to open hole 227, 228 and contact hole 222.

Referring to FIG. 17, contact hole 222 and hole 227, 228 are filled with aluminum containing 0.5% by weight of copper to form connecting portion 202 and the second interconnection layer 203, 230.

The connecting portion 202 formed by this method has a diameter of approximately 0.3 μm, and such problems as increased electric resistance in connecting portion 202 and defective connection between the first interconnection layer 109 and the second interconnection layer 203 did not occur.

(Third Example)

Referring to FIGS. 18–24, the method of forming a multi-layer interconnection according to a third example of the present invention will be described.

Referring to FIG. 18, interlayer insulating film 201a including a silicon oxide film is formed on semiconductor substrate 101 consisting of silicon. Buried in interlayer insulating film 201a is the first interconnection layer 109, 110 having a width of 0.3 μm formed of aluminum containing 0.5% by weight of copper. The distance between interlayer insulating film 201a surface and the first interconnection layer 109 is shorter than those of the first and second examples, being approximately 800 nm. Interlayer insulating film 201a surface is planarized. Resist containing naphthoquinone diazide photosensitive material and novolak resin is applied on interlayer insulating film 201a surface, and resist pattern 241 for the contact hole with hole 270 having a diameter of 0.3 μm is formed by photolithography.

Referring to FIG. 19, resist pattern 241 is used as a mask and interlayer insulating film 201a is etched by reactive ions in a mixed gas of $CHF_3$ and $O_2$ to form contact hole 242 such that its bottom wall reaches the first interconnection layer 109. As the distance between interlayer insulating film 201a surface and the first interconnection layer 109 is shorter than those of the first and second examples, contact hole 242 can be easily formed.

Referring to FIG. 20, organic material containing polyimide is applied such that it fills contact hole 242 and covers the entire surface of interlayer insulating film 201b and the organic material is etched by reactive ions in a mixed gas of $O_2$ and $N_2$ to form buried portion 243 with the interior of contact hole 242 formed of the organic material. The surface of interlayer insulating film 201a and the surface of buried portion 243 formed of the organic material are made to be nearly level with each other.

Referring to FIG. 21, since the maximum temperature which polyimide, which is buried in buried portion 243, withstands is approximately 200° C., interlayer insulating film 201b including a silicon oxide film is formed on interlayer insulating film 201a below 200° C. Then, resist containing naphthoquinone diazide photosensitive material and novolak resin is applied on interlayer insulating film 201b surface, and resist pattern 245 for the first interconnection layer is formed by photolithography. As interlayer insulating film 201b surface is nearly planarized, the thickness of resist pattern 245 is almost uniform. This allows resist pattern 245 to be formed precisely.

Referring to FIG. 22, resist pattern 245 is used as a mask and interlayer insulating films 201a, 201b are etched by reactive ions in a mixed gas of $CHF_3$ and $O_2$ to form hole 246, 247 for the interconnection layer.

Referring to FIG. 23, the polyimide of buried portion 243 and the novolak resin of resist pattern 245 are reacted with $O_2$ plasma to open hole 246, 247 and contact hole 242.

Referring to FIG. 24, contact hole 242 and hole 246, 247 are filled with aluminum containing 0.5% by weight of copper to form connecting portion 202 and the second interconnection layer 203, 249.

For the connecting portion 202 formed by this method, such problems as increased electric resistance and defective connection between the first interconnection layer 109 and the second interconnection layer 203 due to connecting portion 202 having a diameter of 0.3 μm and hence having a reduced diameter, did not occur.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a multi-layer interconnection, comprising the steps of:

removing a portion of an insulating layer having a main surface and covering a first conductive layer formed on a semiconductor substrate to form a hole reaching said first conductive layer in said insulating layer;

forming an organic layer at least filling said hole;

removing a portion of said insulating layer contacting said organic layer filling said hole;

removing said organic layer filling said hole to form a recessed portion continuous to said hole in said insulating layer; and forming a second conductive layer in such a manner that it fills said hole and said recessed portion.

2. The method of forming a multi-layer interconnection according to claim 1, wherein the step of forming said hole includes forming a resist pattern on the main surface of said insulating layer and removing said insulating layer according to said resist pattern.

3. The method of forming a multi-layer interconnection according to claim 1, wherein the step of forming said organic layer includes filling said hole with an organic layer while forming an organic layer on the main surface of said insulating layer, and etching back the organic layer until the main surface of said insulating layer appears.

4. The method of forming a multi-layer interconnection according to claim 1, wherein the step of removing a portion of said insulating layer includes forming a resist pattern on the main surface of said insulating layer and removing said insulating layer according to said resist pattern.

5. The method of forming a multi-layer interconnection according to claim 1, wherein said first conductive layer is at least one component selected from the group consisting of an impurity region formed in said semiconductor substrate and an interconnection layer formed on said semiconductor substrate.

6. The method of forming a multi-layer interconnection according to claim 1, wherein said first and second conductive layers includes a portion having a width of less than 0.5 μm.

7. A method of forming a multi-layer interconnection, comprising the steps of:

removing a portion of an insulating layer having a main surface and covering a first conductive layer formed on a semiconductor substrate to form a hole reaching said first conductive layer in said insulating layer;

forming an organic layer in such a manner that it fills said hole and covers the main surface of said insulating layer;

removing a portion of said insulating layer contacting said organic layer filling said hole, and a portion of said organic layer formed on the portion of said insulating layer;

removing said organic layer filling said hole to form a recessed portion continuous to said hole in said insulating layer; and forming a second conductive layer in such a manner that it fills said hole and said recessed portion.

8. The method of forming an multi-layer interconnection according to claim 7, wherein the step of forming said hole includes forming a resist pattern on the main surface of said insulating layer and removing said insulating layer according to said resist pattern.

9. The method of forming an multi-layer interconnection according to claim 7, wherein the step of removing a portion of said insulating layer and a portion of said organic layer includes forming a resist pattern on said organic layer and removing said insulating layer and said organic layer according to said resist pattern.

10. The method of forming a multi-layer interconnection according to claim 7, wherein said first conductive layer is at least one component selected from the group consisting of an impurity region formed in said semiconductor substrate and an interconnection layer formed on said semiconductor substrate.

11. The method of forming a multi-layer interconnection according to claim 7, wherein said first and second conductive layers include a portion having a width of less than 0.5 μm.

12. The method of forming a multi-layer interconnection according to claim 7, wherein said organic layer contains an antireflection material.

13. A method of forming a multi-layer interconnection, comprising the steps of:

removing a portion of a first insulating layer having a main surface and covering a first conductive layer formed on a semiconductor substrate to form a first hole reaching said first conductive layer in said first insulating layer;

forming an organic layer at least filling said first hole;

forming a second insulating layer on said organic layer and said first insulating layer main surface;

removing a portion of said second insulating layer to form a second hole reaching said organic layer filling said first hole in said second insulating layer;

removing said organic layer filling said first hole to communicate said first hole with said second hole; and forming a second conductive layer in such a manner that it fills said first hole and said second hole.

14. A method of forming a multi-layer interconnection according to claim 13, wherein the step of forming said first hole includes forming a resist pattern on the main surface of said first insulating layer and removing said first insulating layer according to said resist pattern.

15. The method of forming a multi-layer interconnection according to claim 13, wherein the step of forming said organic layer includes filling said first hole with an organic layer while forming an organic layer on the main surface of said first insulating layer, and etching back the organic layer until the main surface of said first insulating layer appears.

16. The method of forming a multi-layer interconnection according to claim 13, wherein the step of forming said second hole includes forming a resist pattern on a main surface of said second insulating layer and removing said second insulating layer according to said resist patter.

17. The method of forming a multi-layer interconnection according to claim 13, wherein the step of forming said second insulating layer includes forming said second insulating layer at a temperature which said organic layer withstands.

18. The method of forming a multi-layer interconnection according to claim 13, wherein said first conductive layer is at least one component selected from the group consisting of an impurity region formed in said semiconductor substrate and an interconnection layer formed on said semiconductor substrate.

19. The method of forming a multi-layer interconnection according to claim 13, wherein said first and second conductive layers include a portion having a width of less than 0.5 μm.

20. The method according to claim 1, comprising forming the organic layer completely filling the said hole.

21. The method according to claim 7, comprising forming the organic layer completely filling the said hole.

22. The method according to claim 13, comprising forming the organic layer completely filling the said hole.

* * * * *